United States Patent
Iwaki et al.

(10) Patent No.: US 9,852,812 B2
(45) Date of Patent: Dec. 26, 2017

(54) STORAGE APPARATUS, MEMORY CONTROLLER, CONTROL METHOD FOR STORAGE APPARATUS, AND PROGRAM

(71) Applicant: Sony Corporation, Tokyo (JP)

(72) Inventors: Hiroyuki Iwaki, Kanagawa (JP); Ken Ishii, Tokyo (JP); Ryoji Ikegaya, Kanagawa (JP); Kenichi Nakanishi, Tokyo (JP); Yasushi Fujinami, Tokyo (JP); Naohiro Adachi, Tokyo (JP)

(73) Assignee: Sony Corporation, Tokyo (JP)

( * ) Notice: Subject to any disclaimer, the term of this patent is extended or adjusted under 35 U.S.C. 154(b) by 164 days.

(21) Appl. No.: 14/534,579

(22) Filed: Nov. 6, 2014

(65) Prior Publication Data

US 2015/0170763 A1   Jun. 18, 2015

(30) Foreign Application Priority Data

Dec. 18, 2013   (JP) ................. 2013-260813

(51) Int. Cl.
*G11C 7/00* (2006.01)
*G11C 29/00* (2006.01)
*G11C 8/06* (2006.01)

(52) U.S. Cl.
CPC ............. *G11C 29/76* (2013.01); *G11C 8/06* (2013.01)

(58) Field of Classification Search
CPC ..... G11C 29/24; G11C 29/781; G11C 29/785; G11C 29/802
USPC .................... 365/200, 201, 189.16
See application file for complete search history.

(56) References Cited

U.S. PATENT DOCUMENTS

| | | | | |
|---|---|---|---|---|
| 6,167,540 A * | 12/2000 | Azuma | ............... | G11C 29/844 365/200 |
| 6,249,467 B1 * | 6/2001 | Pereira | ............... | G11C 15/00 365/200 |
| 6,301,164 B1 * | 10/2001 | Manning | ............... | G11C 29/785 365/200 |
| 6,367,030 B1 * | 4/2002 | Yamauchi | ............... | G11C 29/76 365/200 |
| 6,704,828 B1 * | 3/2004 | Merritt | ............... | G11C 7/1036 365/63 |
| 2004/0057316 A1 * | 3/2004 | Kozakai | ............... | G06F 11/1068 365/222 |
| 2012/0182816 A1 * | 7/2012 | Ide | ............... | G11C 29/56008 365/200 |

FOREIGN PATENT DOCUMENTS

JP   2003-076615   3/2003

* cited by examiner

*Primary Examiner* — Han Yang
(74) *Attorney, Agent, or Firm* — Michael Best & Friedrich LLP

(57) ABSTRACT

There is provided a storage apparatus that includes an address obtaining section, and a write processing section. The address obtaining section is configured to obtain a normal write address and an alternative write address before data writing to the normal write address, the normal write address being designated as a destination of the data writing, the alternative write address being used when the data writing is failed. The write processing section is configured to perform the data writing to the normal write address when instructed for the data writing, and perform the data writing to the alternative write address when the data writing to the normal write address is failed.

6 Claims, 19 Drawing Sheets

471

| Identification information | Alternative write address | After-use flag |
|---|---|---|
| #0 | Physical address PAB_0 | 1 (Used) |
| #1 | Physical address PAB_1 | 1 (Used) |
| ⋮ | ⋮ | ⋮ |
| #7 | Physical address PAB_7 | 0 (Not used) |

STORAGE APPARATUS, MEMORY
CONTROLLER, CONTROL METHOD FOR
STORAGE APPARATUS, AND PROGRAM

CROSS REFERENCE TO RELATED
APPLICATIONS

This application claims the benefit of Japanese Priority Patent Application JP 2013-260813 filed Dec. 18, 2013, the entire contents of which are incorporated herein by reference.

BACKGROUND

The present disclosure relates to a storage apparatus, a memory controller, a control method for the storage apparatus, and a program run for a computer to perform the method. More specifically, the present disclosure relates to a storage apparatus performing data writing, a memory controller, a control method for the storage apparatus, and a program run for a computer to perform the method.

In a previous storage apparatus exemplified by a memory, writing of write data is followed by verification to determine whether the data writing is successful. Herein, the verification is a process performed by the storage apparatus after the writing of write data at a write address. This verification process is to verify the write data stored in advance in the storage apparatus against data read from the write address. When there is no match between these data, a write error is notified to a memory controller.

Such a write error leads to predetermined exception handling. As an example, Japanese Patent Application Laid-Open No. 2003-76615 describes a memory system in which, when receiving a write error after transmission of a write command, a memory controller transmits another write command including a different write address to ask a memory to try again writing of data (hereinafter, referred to as Patent Document 1).

SUMMARY

With the above-mentioned previous technology of Patent Document 1, however, performing data writing at a high speed is difficult. In the memory system, when failing in data writing to the first write address, the memory is expected to transmit a write error to the memory controller. In response to the write error provided after transmission of a write command, the memory controller is expected to transmit another write command including a different write address to the memory. This causes a longer delay due to transferring and processing of both the write error and the write command in addition to a second try of data writing, thereby taking a long time until data writing is done.

It is thus desirable to provide a storage apparatus performing data writing at a high speed.

According to a first embodiment of the present disclosure, there are provided a storage apparatus including an address obtaining section and a write processing section, and a control method for the storage apparatus. The address obtaining section is configured to obtain a normal write address and an alternative write address before data writing to the normal write address, the normal write address being designated as a destination of the data writing, the alternative write address being used when the data writing is failed. The write processing section is configured to perform the data writing to the normal write address when instructed for the data writing, and perform the data writing to the alternative write address when the data writing is failed.

With such a storage apparatus and a control method therefor, a normal write address and an alternative write address are obtained before data writing to the normal write address. When the data writing to the normal write address is failed, the data writing is performed to the alternative write address.

In the first embodiment, the write processing section may include a normal write processing section, and an alternative write processing section. The normal write processing section is configured to perform the data writing to the normal write address when instructed for the data writing. The alternative write processing section is configured to perform the data writing to the alternative write address when the data writing to the normal write address is failed. In this configuration, when the normal write processing section fails in data writing, the alternative write processing section performs the data writing to the alternative write address.

Also in the first embodiment, the storage apparatus may further include a storage section that is configured to store management information indicating whether each alternative write address of a plurality of alternative write addresses is done with the data writing. The address obtaining section may obtain the alternative write addresses before the data writing to the normal write address, and when the data writing to the normal write address is failed, the write processing section may refer to the management information to select any of the alternative write addresses not done with the data writing, and may perform the data writing to the alternative write address. In this configuration, any of the alternative write addresses not yet done with data writing is selected, and the data writing is then performed to the selected alternative write address.

Also in the first embodiment, the address obtaining section may obtain the normal write address and the alternative write address from a write command asking for the data writing, and the write processing section may perform the data writing in accordance with the write command. In this configuration, the normal and alternative write addresses included in the write command are obtained.

According to a second embodiment of the present disclosure, there is provided a control apparatus that includes an access control section, and an address supply section. The access control section is configured to issue an instruction for data writing. The address supply section is configured to supply a normal write address and an alternative write address before the data writing to the normal write address, the normal write address being designated as a destination for the data writing, the alternative write address being used when the data writing is failed. With such a control apparatus, a normal write address and an alternative write address are supplied before data writing to the normal write address.

According to a third embodiment of the present disclosure, there is provided a storage system including an access control section, an address supply section, an address obtaining section, and a write processing section. The access control section is configured to issue an instruction for data writing. The address supply section is configured to supply a normal write address and an alternative write address before the data writing to the normal write address, the normal write address being designated as a destination for the data writing, the alternative write address being used when the data writing is failed. The address obtaining section is configured to obtain the normal write address and the alternative write address before the data writing to the normal write address. The write processing section is configured to perform the data writing to the normal write address when instructed for the data writing, and perform the data writing to the alternative write address when the data writing to the normal write address is failed. With such a storage system, a normal write address and an alternative write address are obtained before data writing to the normal write address. When the data writing to the normal write address is failed, the data writing is performed to the alternative write address.

Also in the third embodiment, the write processing section may include a normal write processing section, and an alternative write processing section. The normal write processing section is configured to perform the data writing to the normal write address when instructed for the data writing. The alternative write processing section is configured to perform the data writing to the alternative write address when the data writing to the normal write address is failed. In this configuration, when the normal write processing section fails in data writing, the alternative write processing section performs the data writing to the alternative write address.

Also in the third embodiment, the address supply section may supply a plurality of alternative write addresses before the data writing to the normal write address. The write processing section may notify the address supply section of identification information every time performing the data writing to any of the alternative write addresses, the identification information being information for identifying which of the alternative write addresses is done with the data writing. The address supply section may refer to the identification information to determine whether the alternative write addresses are all done with the data writing, and when determining that the alternative write addresses are all done with the data writing, may supply a plurality of different alternative write addresses.

Also in the third embodiment, the storage system may further include an address conversion table showing a correlation between a logical address and a physical address. When any of logical addresses is designated as a destination for the data writing, the address supply section may supply any of physical addresses not correlated with the designated logical address as the alternative write address. After performing the data writing to the alternative write address, the write processing section may determine whether the data writing is successful, and when determining that the data writing is successful, notify the address supply section that the alternative write address is done with the data writing. When notified that the alternative write address is done with the data writing, the address supply section may establish a correlation between the alternative write address and the designated logical address in the address conversion table. In this configuration, in response to a notification about the alternative write address being done with data writing, the alternative write address is correlated with the designated logical address in the address conversion table.

According to the embodiments of the present disclosure, there is provided a storage apparatus that can produce an excellent effect of performing data writing at a high speed.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure (hereinafter, simply referred to as embodiments) will be described with reference to the drawings. The description is given in the following order.

1. First Embodiment (example of obtaining an alternative write address before data writing)
2. Second Embodiment (example of obtaining a plurality of alternative write addresses before data writing)

1. First Embodiment

Figure 1:
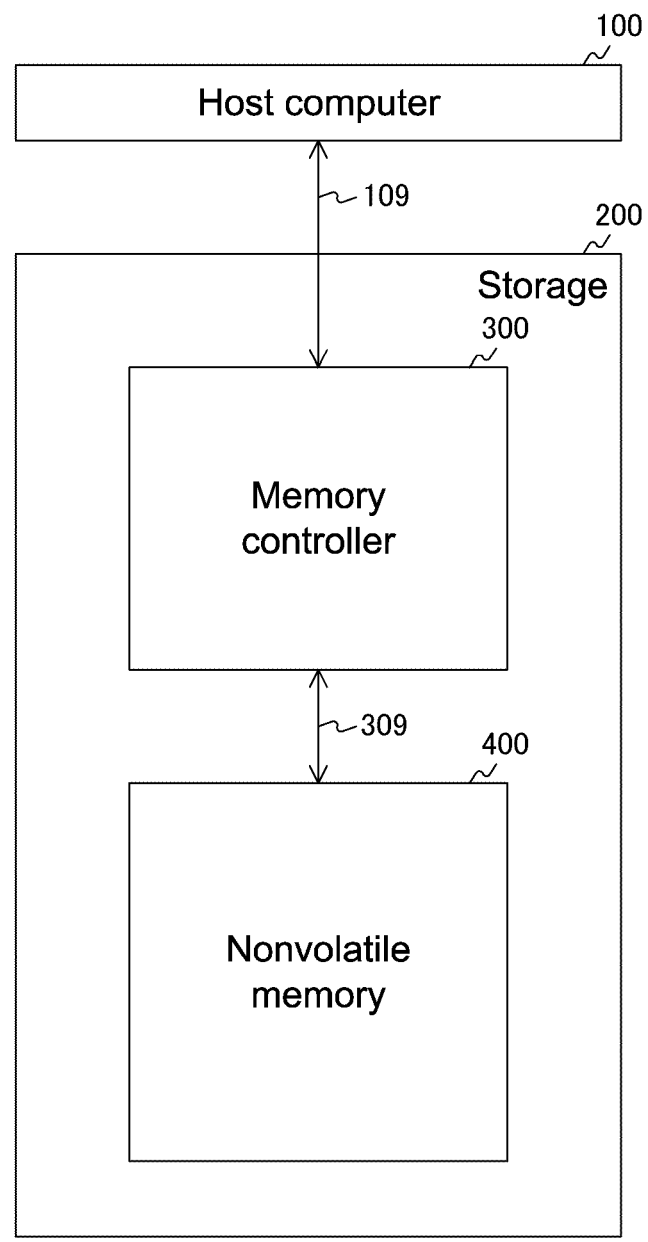
FIG. 1 is a general view of a memory system in a first embodiment of the present disclosure, showing an exemplary configuration thereof.

[Exemplary Configuration of Memory System]
FIG. 1 is a general view of a memory system in a first embodiment, showing an exemplary configuration thereof. This memory system includes a host computer 100, and a storage 200. The storage 200 includes a memory controller 300, and a nonvolatile memory 400. Note that this memory system is an example of a storage system claimed in Claims.

The host computer 100 is for controlling the memory system in its entirety. To be specific, the host computer 100 instructs the memory controller 300 to perform writing of write data and reading of read data to/from a logical address designated as an access destination.

The logical address is one which is assigned in an address space on an access unit basis. The address space is defined by the host computer 100 and/or the memory controller 300, and the access unit is for the host computer 100 to make an access to the storage 200.

The memory controller 300 is for controlling the nonvolatile memory 400. This memory controller 300 converts the designated logical address into a physical address in response to an instruction from the host computer 100 for writing of write data. The memory controller 300 then issues a write command in which the resulting converted physical address is designated as an access destination. This write command is supplied to the nonvolatile memory 400 with the write data over a signal line 309.

The physical address is one which is assigned in the nonvolatile memory 400 on an access unit basis. The access unit herein is for the memory controller 300 to make an access to the nonvolatile memory 400. The nonvolatile memory 400 is desirably larger in capacity than the address space for each logical address. This is to reserve therein another alternative physical address for the designated logical address for use when writing to the current physical address is failed.

Moreover, the memory controller 300 converts the designated logical address into a physical address also in response to an instruction from the host computer 100 for reading of read data. The memory controller 300 then issues a read command in which the resulting converted physical address is designated as an access destination. This read command is supplied to the nonvolatile memory 400 over the signal line 309. The memory controller 300 receives the read data from the nonvolatile memory 400, and transfers the data to the host computer 100.

The memory controller 300 also receives a status from the nonvolatile memory 400. This status is information about the result of command execution, and about in what state the memory controller 300 is, for example.

Note that the memory controller 300 is an example of a control apparatus claimed in Claims.

The nonvolatile memory 400 is for storing data under the control of the memory controller 300. When receiving a write command and write data from the memory controller 300, the nonvolatile memory 400 writes the write data to a physical address designated in the write command. When receiving a read command from the memory controller 300, the nonvolatile memory 400 reads data from a physical address designated in the read command, and supplies the data to the memory controller 300. The nonvolatile memory 400 generates a status for supply to the memory controller 300.

Alternatively, data may be stored not by the nonvolatile memory 400 as described above but by any other storage apparatus such as HDD (Hard Disk Drive). The nonvolatile memory 400 is an example of a storage apparatus claimed in Claims.

[Exemplary Configuration of Memory Controller]

Figure 2:
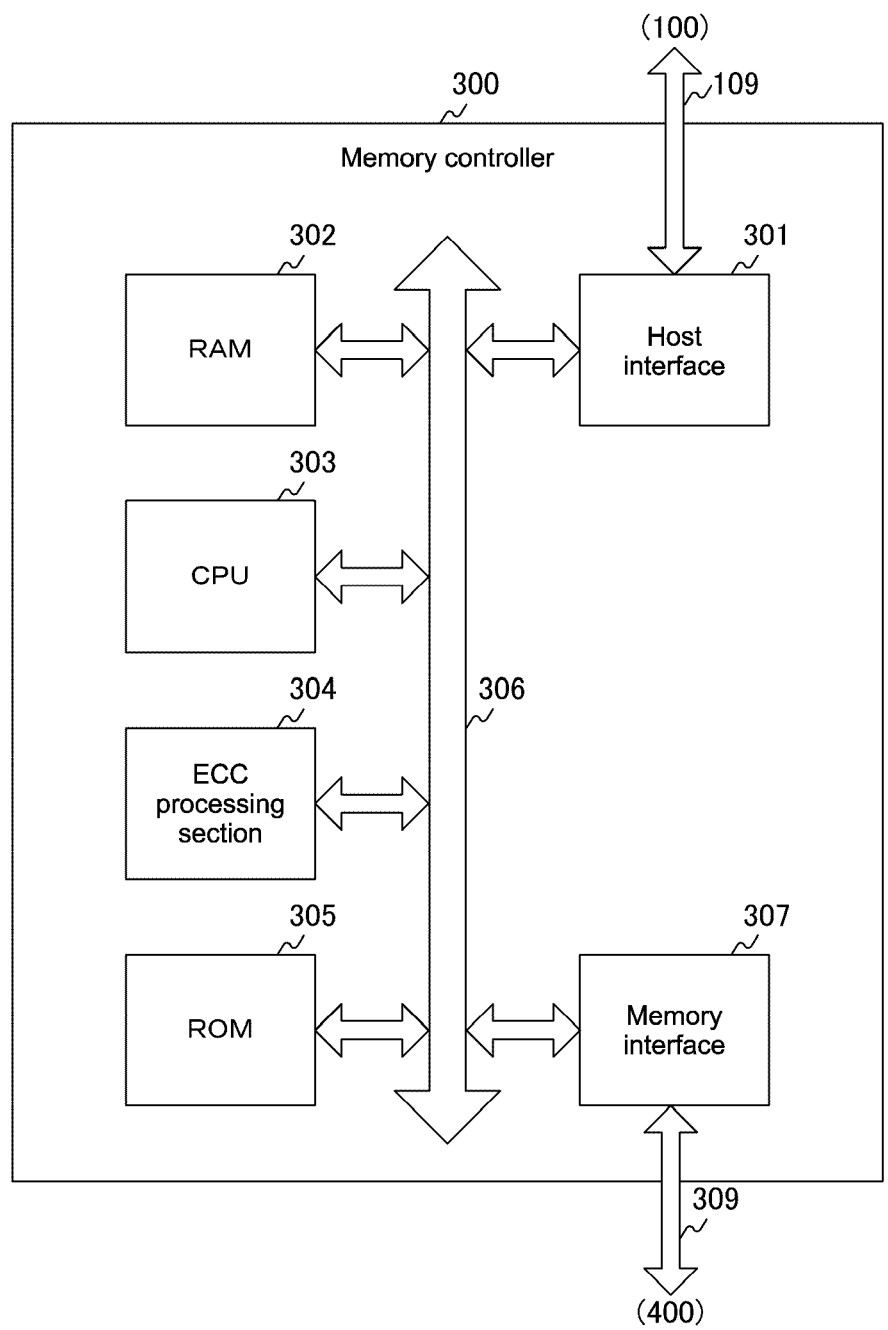
FIG. 2 is a block diagram showing an exemplary configuration of a memory controller in the first embodiment.

FIG. 2 is a block diagram showing an exemplary configuration of the memory controller 300 in the first embodiment. This memory controller 300 includes a host interface 301, a RAM (Random Access Memory) 302, and a CPU (Central Processing Unit) 303. The memory controller 300 also includes an ECC (Error detection and Correction Code) processing section 304, a ROM (Read Only Memory) 305, a bus 306, and a memory interface 307.

The host interface 301 is for mutual exchange of data and commands between the memory controller 300 and the host computer 100. The RAM 302 is for temporarily storing data for use in processes to be executed by the CPU 303. The CPU 303 is for controlling the memory controller 300 in its entirety.

The ECC processing section 304 performs ECC encoding on data, and based thereon, detects and corrects any error in the data. For ECC encoding by the ECC processing section 304, BCH (Bose-Chaudhuri-Hocquenghem) codes or RS (Reed-Solomon) codes are used, for example. When failing in detecting and correcting any error, the ECC processing section 304 describes a read error for supply to the host computer 100.

The ROM 305 is for storing programs or others to be run by the CPU 303. The bus 306 is shared for mutual exchange of data by the components, i.e., the host interface 301, the RAM 302, the CPU 303, the ECC processing section 304, the ROM 305, and the memory interface 307. The memory interface 307 is for mutual exchange of data and commands between the memory controller 300 and the nonvolatile memory 400.

Figure 3:
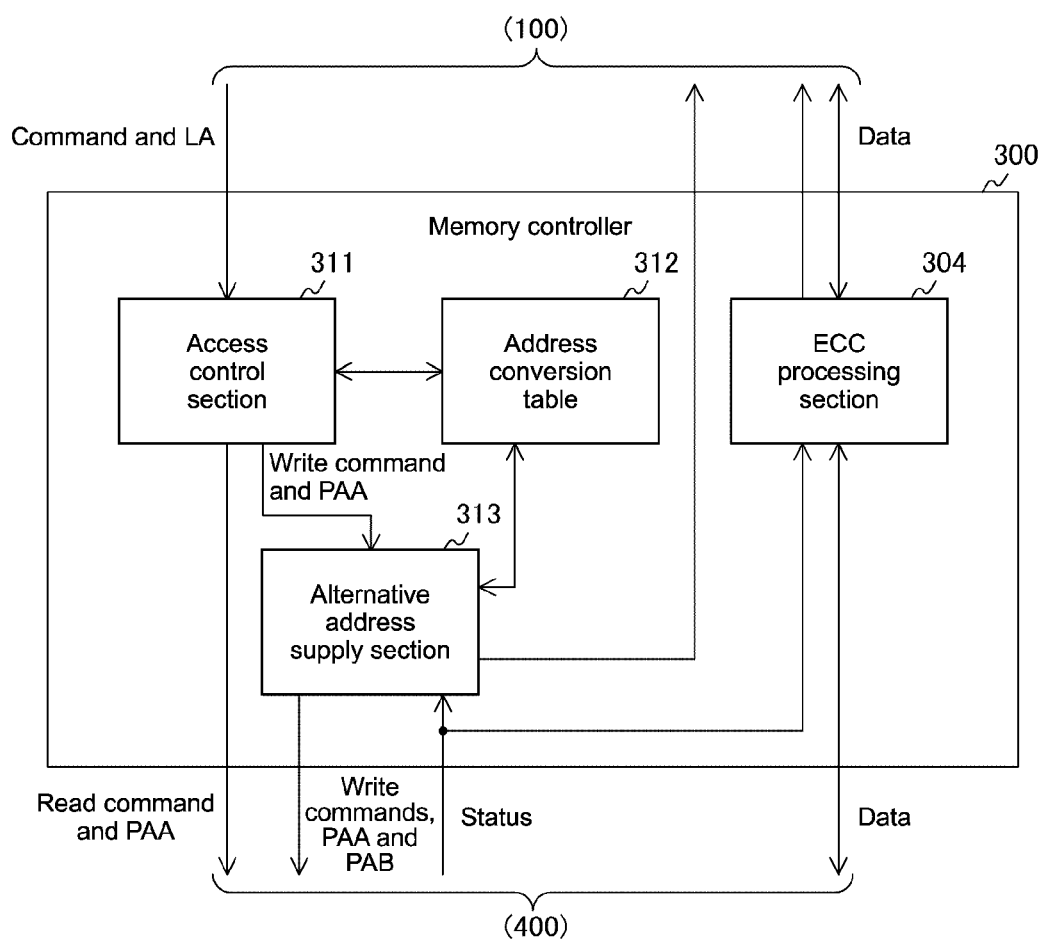
FIG. 3 is a block diagram showing an exemplary function structure of the memory controller in the first embodiment.

FIG. 3 is a block diagram showing an exemplary function structure of the memory controller 300 in the first embodiment. This memory controller 300 includes an access control section 311, an address conversion table 312, an alternative write address supply section 313, and the ECC processing section 304.

The access control section 311 and the alternative write address supply section 313 of FIG. 3 are realized in terms of function by the components of FIG. 2, e.g., the host interface 301, the RAM 302, the CPU 303, the ROM 305, and the memory interface 307. The address conversion table 312 of FIG. 3 is stored in the RAM 302 of FIG. 2, for example.

The access control section 311 is for performing processes of writing and reading to/from the nonvolatile memory 400. When instructed by the host computer 100 to perform writing of write data, this access control section 311 converts a designated logical address into a physical address based on the address conversion table 312. The access control section 311 then issues a write command in which the resulting converted physical address is designated as a normal write address PAA. This write command is supplied to the alternative write address supply section 313.

Moreover, when instructed by the host computer 100 to perform reading of read data, the access control section 311 converts a designated logical address into a physical address based on the address conversion table 312. The access control section 311 then issues a read command in which the resulting converted physical address is designated as a read address. This read command is supplied to the nonvolatile memory 400.

The alternative write address supply section 313 is for supplying an alternative write address PAB before writing of data to the normal write address PAA. Herein, the alternative write address is a physical address used as an alternative to a normal write address PAA when data writing to the normal write address is failed. The alternative write address supply section 313 obtains a physical address from the address conversion table 312 for use as an alternative write address PAB. The alternative write address supply section 313 then issues a write command for supply to the nonvolatile memory 400. This write command includes this alternative write address PAB with the normal write address PAA. The alternative write address supply section 313 also updates the address conversion table 312 based on a status provided by the nonvolatile memory 400, and transfers the status to the host computer 100. The details about this update will be described later. Herein, the alternative write address supply section 313 is an example of an address supply section claimed in Claims.

The address conversion table 312 provides a correlation between logical addresses and physical addresses. This address conversion table 312 indicates whether each logical address is correlated with a physical address, for example. The address conversion table 312 also indicates the state of use for each of the physical addresses. The state of use for a physical address is information or others about whether the physical address is correlated with a logical address.

[Exemplary Configuration of Address Conversion Table]

Figure 4:
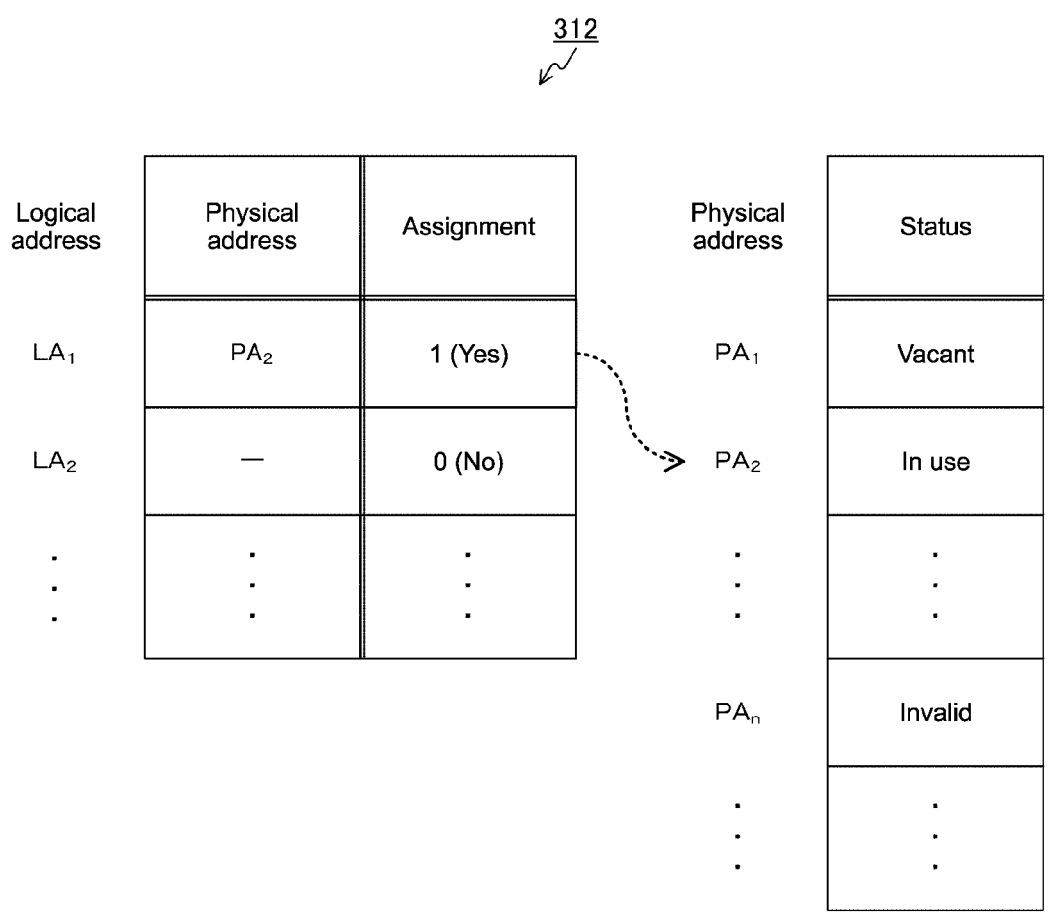
FIG. 4 is a diagram showing an exemplary address conversion table in the first embodiment.

FIG. 4 is a diagram showing an example of the address conversion table 312 in the first embodiment. This address conversion table 312 stores, for each logical address, a physical address and "Yes" or "No" being information about address assignment. This information about "Yes" or "No" indicates whether a logical address is assigned a physical address. In the initial state, there is no address assignment. When no physical address is assigned to a logical address designated as a writing destination by the host computer 100, the logical address is newly assigned a physical address.

The address conversion table 312 also stores information for each physical address about a status thereof. This status is about the state of use or others of the physical address, and indicates "in use", "vacant", or "invalid", for example. The status of "in use" indicates that the physical address is currently in use for writing of data. The status of "vacant" indicates that the physical address is not currently in use for writing of data. The status of "invalid" indicates that the physical address is not available for writing of data due to expired lifetime, for example.

Figure 5A:
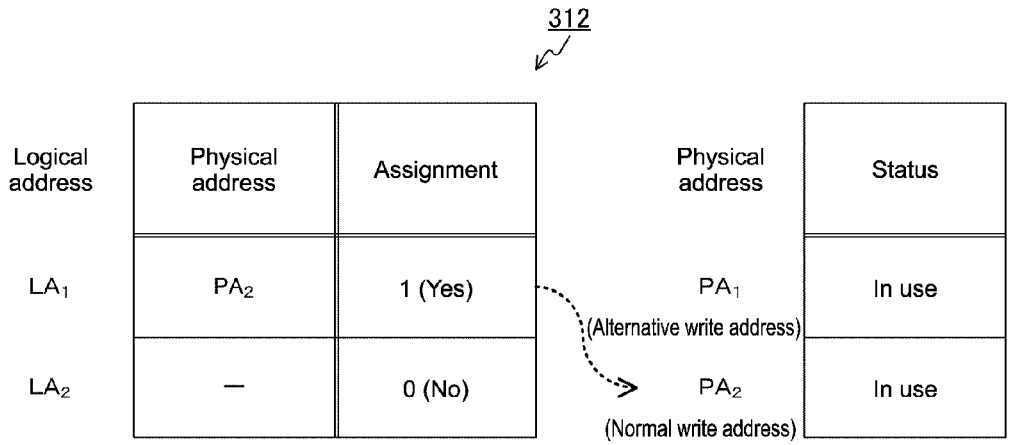
FIGS. 5A to 5C are each a diagram showing an exemplary updated address conversion table in the first embodiment.
Figure 5B:
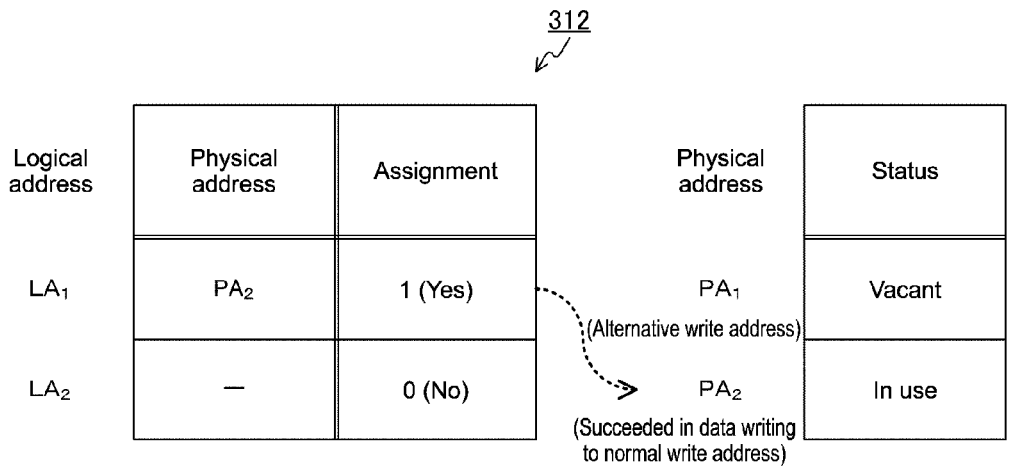
Figure 5C:
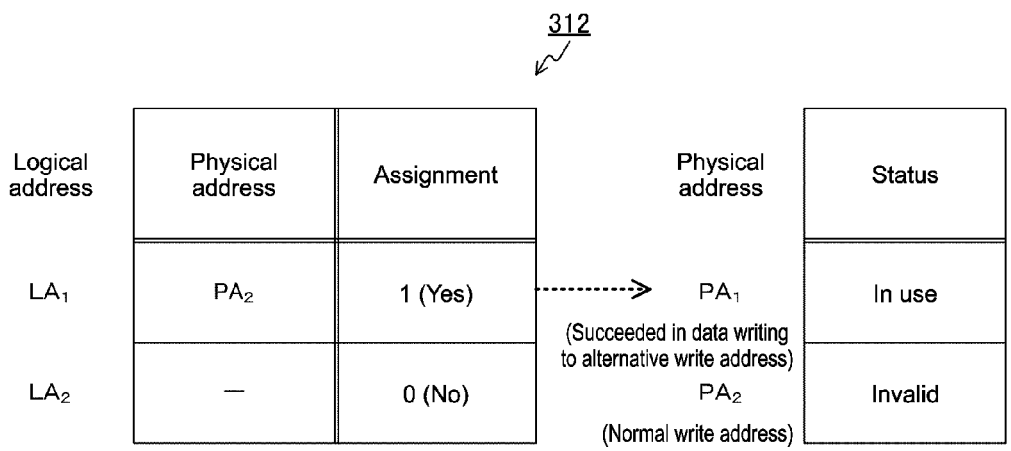

FIGS. 5A to 5C are each a diagram showing an example of the updated address conversion table 312 in the first embodiment. The access control section 311 determines whether a logical address designated by the host computer 100 is assigned a physical address. When determining that there is an address assignment, the access control section 311 issues a write command in which the physical address is designated as a normal write address. On the other hand, when determining that there is no address assignment, the access control section 311 newly assigns any physical address in the status of "vacant" to the designated logical address. The access control section 311 then issues a write command in which the physical address is designated as a normal write address. After the assignment of a new physical address as above, the status of the physical address is updated to "in use" by the access control section 311.

After the designation of a normal write address, the alternative write address supply section 313 selects any physical address in the status of "vacant" as an alternative write address.

When selecting any "vacant" physical address as a normal or alternative write address, the memory controller 300 performs wear levelling as appropriate. The wear levelling is a process of evenly distributing the wear on memory cells in the nonvolatile memory 400. For such wear leveling, the memory controller 300 may record how often each memory cell is accessed, and may give a higher priority to the memory cell address with the lower access frequency for selection as a normal or alternative write address, for example.

FIG. 5A is a diagram showing an example of the address conversion table 312 when a write command is provided to the nonvolatile memory 400. In this address conversion table, a logical address $LA_1$ is assigned a physical address $PA_2$, and a logical address $LA_2$ is assigned no physical address, for example. A physical address $PA_1$ in the initial state is assumed to be in the status of "vacant". When the host computer 100 designates the logical address $LA_1$ as a write destination, for example, the access control section 311 obtains the physical address $PA_2$ correlated with the logical address $LA_1$ as a normal write address. The alternative write address supply section 313 then selects the "vacant" physical address $PA_1$ as an alternative write address, and updates the status thereof to "in use".

When provided by the memory controller 300 a write command in which such normal and alternative write addresses are designated, the nonvolatile memory 400 performs data writing in accordance with the write command. The nonvolatile memory 400 then generates a status based on the result of the writing, and returns the status back to the memory controller 300. This status includes an error flag and a write-destination flag. This error flag indicates whether the data writing is successful. The write-destination flag indicates whether the address done with data writing is the normal write address.

The alternative write address supply section 313 refers to the status provided by the nonvolatile memory 400 to determine whether the data writing is successful, and whether the address done with data writing is the normal write address.

FIG. 5B is a diagram showing an example of the address conversion table 312 when the data writing to the normal write address is successful. In this case, as to the alternative write address correlated with the normal write address, the alternative write address supply section 313 updates the status thereof to "vacant".

FIG. 5C is a diagram showing an example of the address conversion table 312 when the data writing to the alternative write address is successful. In this case, the alternative write address supply section 313 correlates not the normal write address but the alternative write address with a logical address. The alternative write address supply section 313 also updates the status of the normal write address to "invalid".

When the data writing is failed, the alternative write address supply section 313 inputs "No" for the address assignment to the designated logical address, and updates the status of the normal write address and that of the alternative write address to "invalid".

Figure 6A:
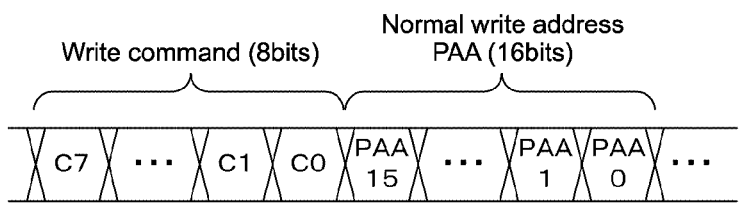
FIGS. 6A and 6B are each a diagram showing an exemplary write command and an exemplary write address in the first embodiment.
Figure 6B:
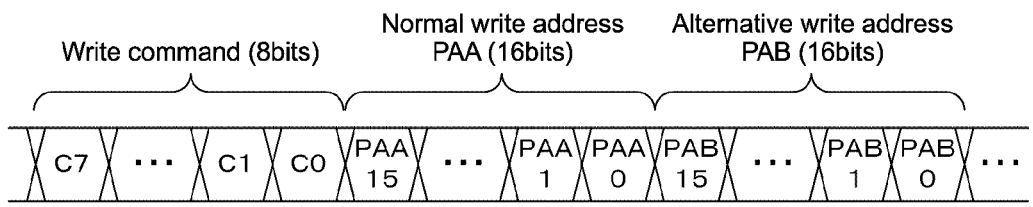
Figure 6C:
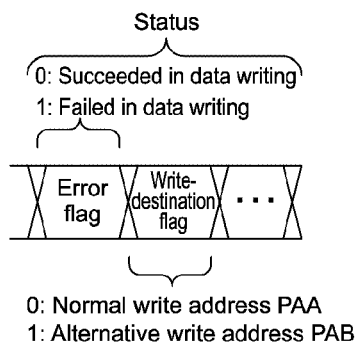
FIG. 6C is a diagram showing an exemplary status therein.

FIGS. 6A and 6B are each a diagram showing an exemplary write command and an exemplary write address in the first embodiment, and FIG. 6C is a diagram showing an exemplary status therein. Specifically, FIG. 6A shows an exemplary write command and an exemplary write address to be generated by the access control section 311. When instructed for data writing, the access control section 311 generates an 8-bit write command, and a 16-bit normal write address PAA.

FIG. 6B is a diagram showing an exemplary write command and an exemplary write address to be supplied by the alternative write address supply section 313. When a write command is issued, the alternative write address supply section 313 supplies an 8-bit alternative write address PAB to the nonvolatile memory 400 together with an 8-bit write command and a 16-bit normal write address PAA.

When the address conversion table 312 includes no "vacant" physical address, the alternative write address supply section 313 may supply such a write command as shown in the example of FIG. 6A, i.e., write command including no alternative write address. Also when no "vacant" physical address is obtained within a fixed period of time due to a processing delay by wear leveling or others, the alternative write address supply section 313 may similarly supply a write command including no alternative write address. In this case, the nonvolatile memory 400 issues a write error notification when failing in data writing to the normal write address, and performs no data writing to the alternative write address.

Alternatively, the alternative write address supply section 313 may transmit an option flag to the nonvolatile memory 400 in addition to commands and addresses. This option flag is an instruction about whether to perform data writing again to the alternative write address. When there is no "vacant" physical address or when no "vacant" physical address is obtained within a fixed period of time, for example, the option flag is transmitted as an instruction not to perform data writing again, but otherwise the option flag is transmitted as an instruction to perform data writing again.

Still alternatively, when data writing is not performed again, the alternative write address supply section 313 may provide the nonvolatile memory 400 with a write command including a code different from that for performing again data writing. Such a different-code write command is provided when there is no "vacant" physical address or when no "vacant" physical address is obtained within a fixed period of time, for example.

Still alternatively, the alternative write address supply section 313 may make settings to a register in the nonvolatile memory 400 about whether to perform data writing again to the alternative write address. When there is no "vacant" physical address or when no "vacant" physical address is obtained within a fixed period of time, for example, the register is so set as not to allow data writing again, but otherwise the register is so set as to allow data writing again.

FIG. 6C is a diagram showing an exemplary status to be generated by the nonvolatile memory 400. The nonvolatile memory 400 generates a status including an error flag, and a write-destination flag. To the error flag, a value of "0" is set when data writing is successful, and a value of "1" is set when data writing is failed, for example. To the write-destination flag, a value of "0" is set when a normal write address PAA is written with data, and a value of "1" is set when an alternative write address PAB is written with data, for example. When the error flag indicates a failure of data writing, the write-destination flag is discarded.

[Exemplary Configuration of Nonvolatile Memory]

Figure 7:
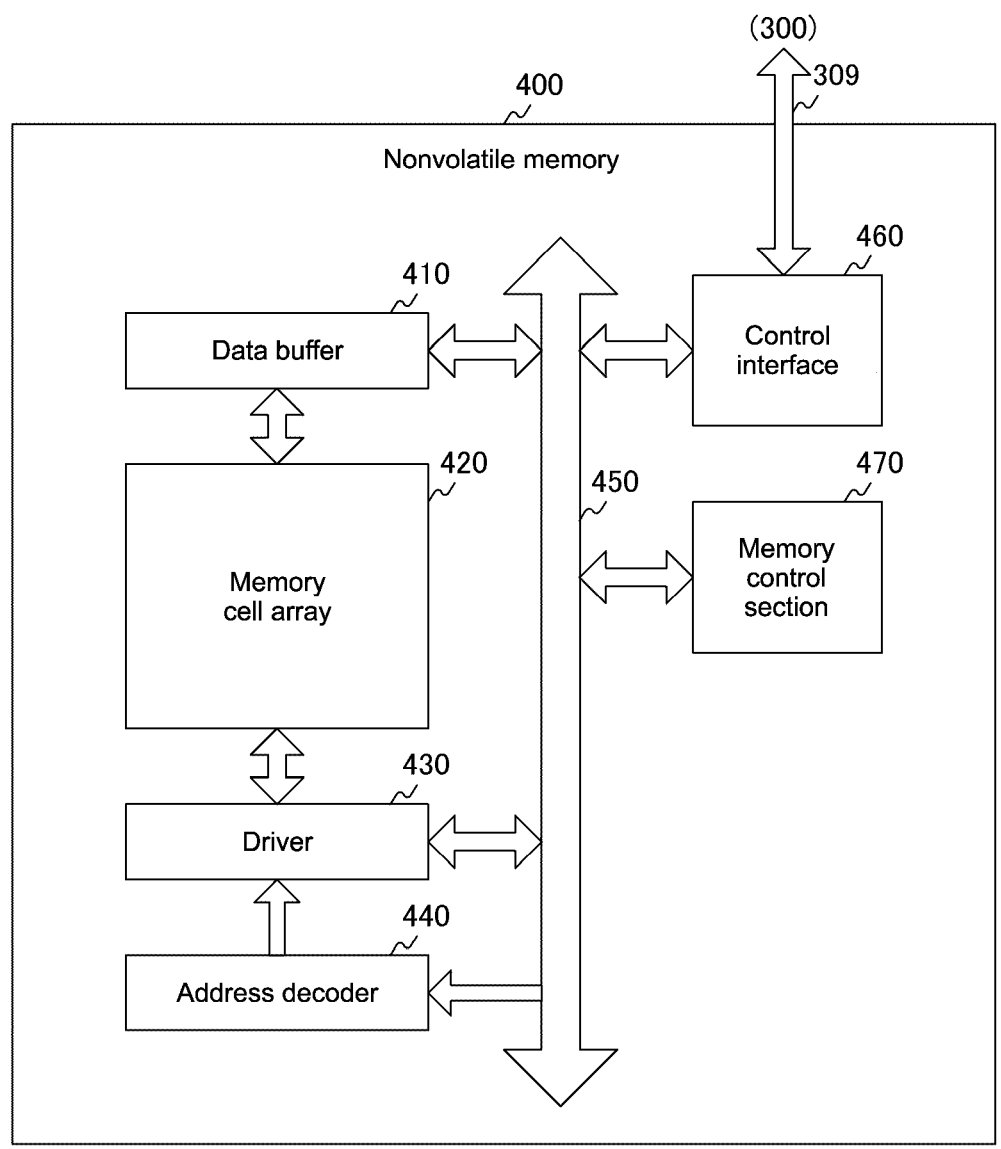
FIG. 7 is a block diagram showing an exemplary configuration of a nonvolatile memory in the first embodiment.

FIG. 7 is a block diagram showing an example of the nonvolatile memory 400 in the first embodiment. This nonvolatile memory 400 includes a data buffer 410, a memory cell array 420, a driver 430, an address decoder 440, a bus 450, a control interface 460, and a memory control section 470.

The data buffer 410 is under the control of the memory control section 410, and stores write and read data on an access basis. The memory cell array 420 includes a plurality of memory cells arranged in a matrix. The memory cells are each a nonvolatile storage element. To be specific, the storage element is a NAND (Negative AND) or NOR (Negative OR) flash memory, a ReRAM (Resistive RAM), a PCRAM (Phase-Change RAM), or an MRAM (Magnetoresistive RAM), or others.

The driver 430 performs writing or reading of data to/from any memory cell selected by the address decoder 440. The address decoder 440 analyzes an address designated in a command, and selects any memory cell corresponding to the address. The bus 450 is shared for mutual exchange of data by the components, i.e., the data buffer 410, the memory cell array 420, the address decoder 440, the memory control section 470, and the control interface 460. The control interface 460 is for mutual exchange of data and commands between the memory controller 300 and the nonvolatile memory 400. This control interface 460 obtains normal and alternative write addresses before data writing is performed to the normal write address. Herein, the control interface 460 is an example of an address obtaining section claimed in Claims.

The memory control section 470 controls both the driver 430 and the address decoder 440 for data writing and reading thereby. When receiving a write command including normal and alternative write addresses, the memory control section 470 makes the data buffer 410 store write data. The memory control section 470 also provides the normal write address designated in the write command to the address decoder 440. When the address decoder selects any memory cell, the memory control section 470 controls the driver 430 for data writing to the memory cell.

The memory control section 470 then controls the driver 430 for data reading from the memory cell done with data writing. The memory control section 470 verifies the read data against the write data stored in the data buffer 410. When there is a match between these data, the memory control section 470 generates a status indicating that the data writing to the normal write address is successful, and provides the status to the memory controller 300 via the control interface 460.

On the other hand, when there is no match between these data, the memory control section 470 determines that the data writing is failed. The memory control section 470 then controls the driver 430 and the address decoder 440 for writing of the write data this time to the alternative write address. The memory control section 470 controls the driver 430 for data reading from any memory cell corresponding to the alternative write address, and performs another verification. Based on the verification result, the memory control section 470 generates a status for supply to the memory controller 300 via the control interface 460.

When receiving a read command, the memory control section 470 controls the address decoder 440 and the driver 430 to make them output read data to the memory controller 300.

As described above, the nonvolatile memory 400 obtains an alternative write address before writing of data to a normal write address. When the data writing to the normal write address is failed, the nonvolatile memory 400 performs data writing to an alternative write address without issuing a write error. The nonvolatile memory 400 thus is not expected to transmit a status indicating a failure of the data writing to the normal write address. Furthermore, the memory controller 300 is not expected to issue a write command including an alternative write address after issuing a write command including a normal write address. This accordingly saves the time for transmission/reception and processing of these status and write command, thereby being able to reduce the time for data writing.

[Exemplary Configuration of Memory Control Section]

Figure 8:
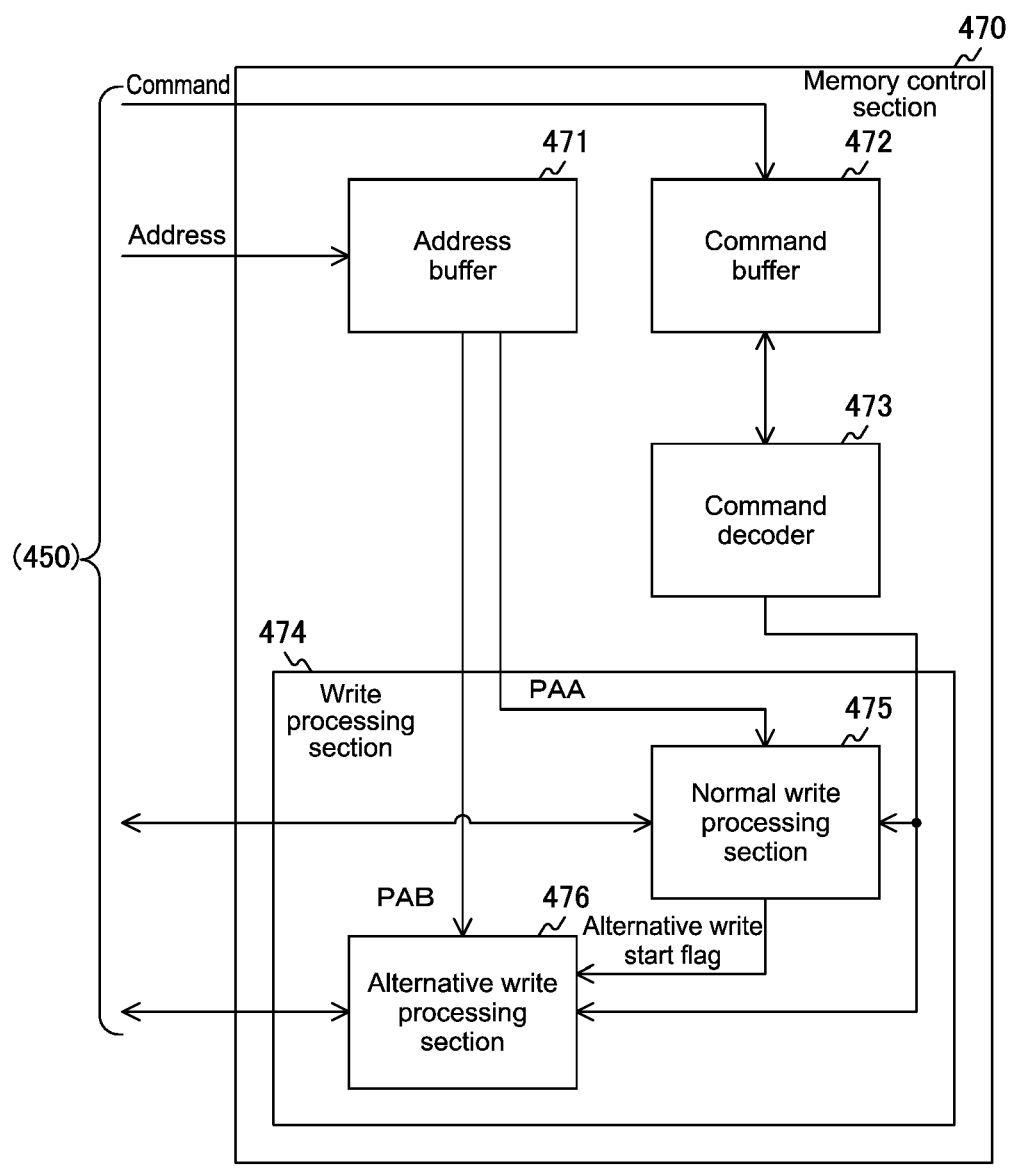
FIG. 8 is a block diagram showing an exemplary configuration of a memory control section in the first embodiment.

FIG. 8 is a block diagram showing an exemplary configuration of the memory control section 470 in the first embodiment. This memory control section 470 includes an address buffer 471, a command buffer 472, a command decoder 473, and a write processing section 474. Note that FIG. 8 shows no structure for the memory control section 470 to perform a read process.

The address buffer 471 is for storing addresses designated in commands, e.g., normal write addresses, alternative write addresses, and read addresses. The command buffer 472 is for storing commands from the memory controller 300.

The command decoder 473 is for decoding the commands from the memory controller 300 to generate a control signal for controlling the driver 430 and the address decoder 440. The command decoder 473 supplies the resulting control signal to a normal write processing section 475, and an alternative write processing section 476.

The write processing section 474 is for controlling the driver 430 and the address decoder 440 to make them perform data writing to a normal or alternative write address. This write processing section 474 includes the normal write processing section 475, and the alternative write processing section 476.

The normal write processing section 475 is for controlling the driver 430 and the address decoder 440 to make them perform data writing to a normal write address. This normal write processing section 475 performs verification after the data writing, and determines whether the data writing is successful. When determining that the data writing is successful, the normal write processing section 475 generates a status for supply to the memory controller 300. This status is a notification about the normal write address being done with data writing. On the other hand, when determining that the data writing is failed, the normal write processing section 475 generates an alternative write start flag for supply to the alternative write processing section 476. This flag is an instruction about data writing to an alternative write address.

When provided with such an alternative write start flag, the alternative write processing section 476 controls the driver 430 and the address decoder 440 to make them perform data writing to the alternative write address. This alternative write processing section 476 performs verification after the data writing, and determines whether the data writing is successful. When determining that the data writing is successful, the alternative write processing section 476 generates a status for supply to the memory controller 300. This status is a notification about the alternative write address being done with data writing. On the other hand, when determining that the data writing is failed, the alternative write processing section 476 generates a status this time about a failure of the data writing, and supplies the status to the memory controller 300.

For convenience of description, the write processing section 474 is configured by the two components based on functions, i.e., the normal write processing section 475, and the alternative write processing section 476. This is not restrictive, and the write processing section 474 may not be explicitly configured by these two processing sections based on functions.

[Exemplary Operation of Memory Controller]

Figure 9:
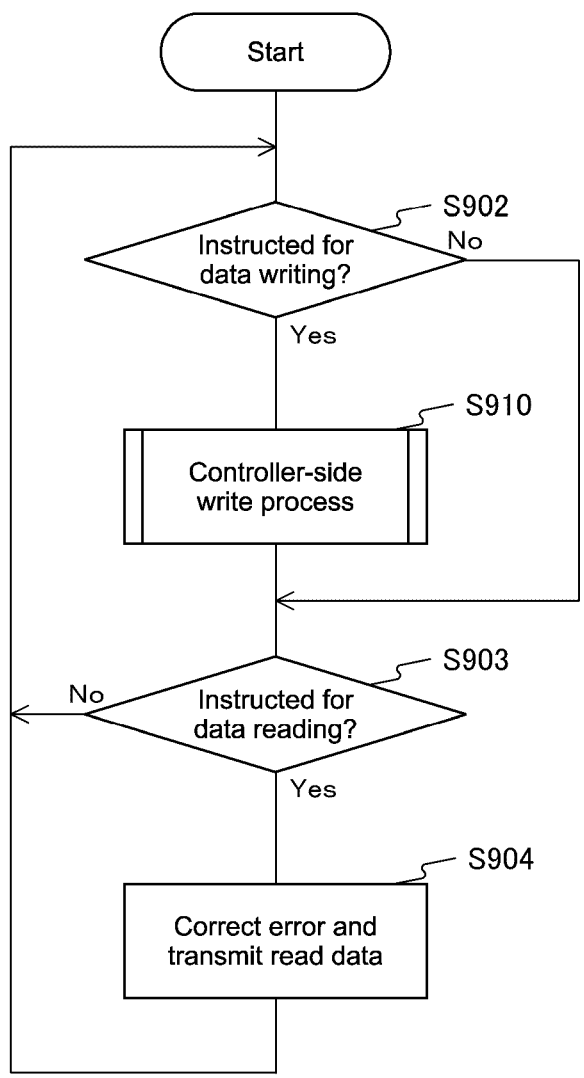
FIG. 9 is an exemplary operation flowchart for the memory controller in the first embodiment.

FIG. 9 is an exemplary operation flowchart for the memory controller 300 in the first embodiment. This operation is started when the storage 200 is turned on, for example.

The memory controller 300 determines whether data writing is instructed by the host computer 100 (step S902). When determining that the data writing is instructed (step S902: Yes), the memory controller 300 performs a controller-side write process (step S910). When determining that the data writing is not instructed (step S902: No) or after step S910, the memory controller 300 determines whether data reading is instructed by the host computer 100 (step S903).

When determining that the data reading is instructed (step S903: Yes), the memory controller 300 performs error correction on the data read from the nonvolatile memory 400, and transmits the error-corrected read data to the host computer 100 (step S904). When determining that the data reading is not instructed (step S903: No) or after step S904, the procedure returns to step S902.

Figure 10:
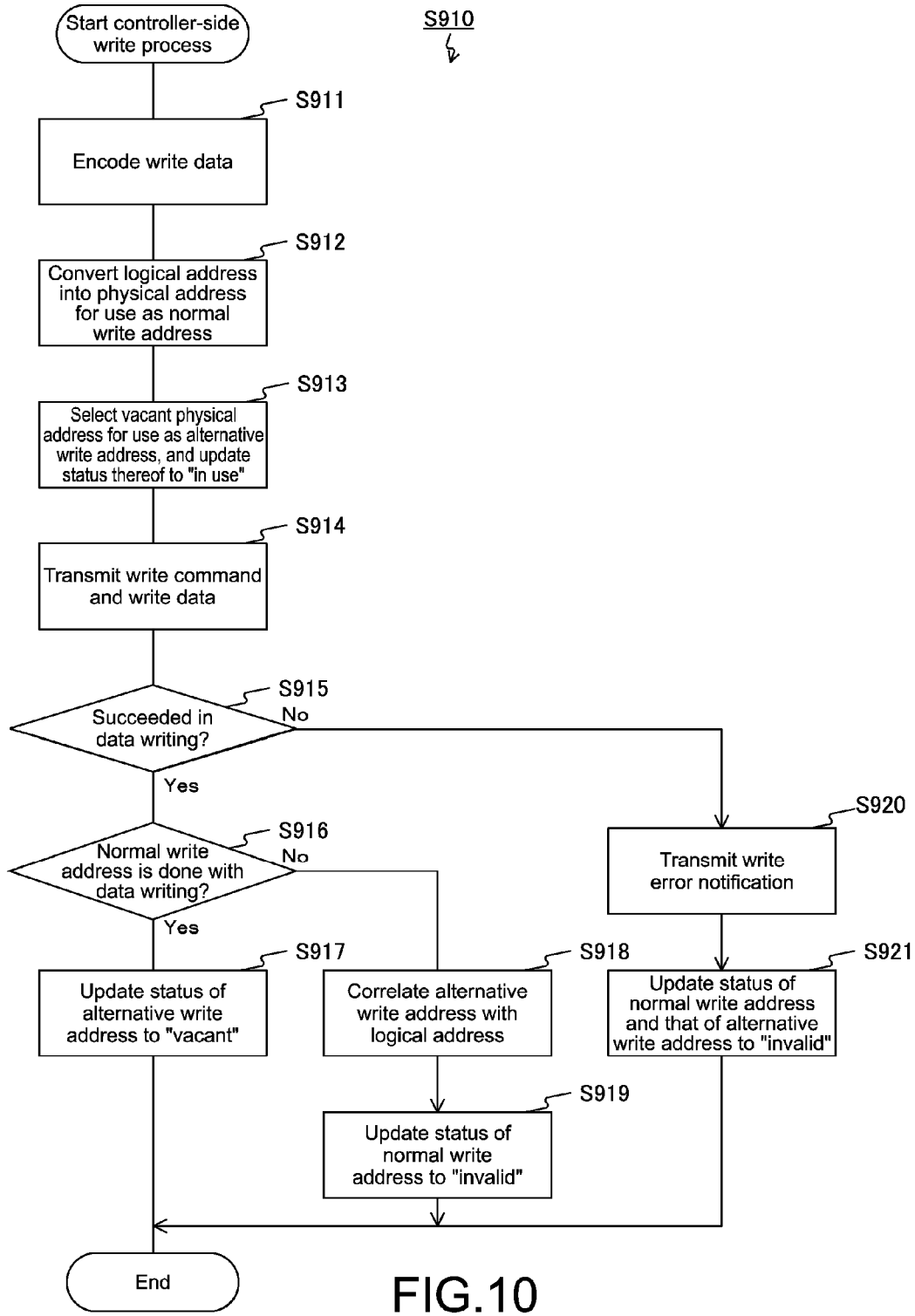
FIG. 10 is a flowchart of an exemplary controller-side write process in the first embodiment.

FIG. 10 is a flowchart of an exemplary controller-side write process in the first embodiment. The memory controller 300 encodes write data (step S911). Using the address conversion table 312, the memory controller 300 converts a logical address designated by the host computer 100 into a physical address for use as a normal write address (step S912). The memory controller 300 also selects a "vacant" physical address in the address conversion table 312 for use as an alternative write address, and updates the status thereof to "in use" (step S913).

The memory controller 300 then provides the nonvolatile memory 400 with a write command including the normal and alternative write addresses, and encoded write data (step S914).

The memory controller 300 refers to the status provided by the nonvolatile memory 400 to determine whether the data writing is successful (step S915). When determining that the data writing is successful (step S915: Yes), the memory controller 300 determines whether the normal write address is done with data writing (step S916). When determining that the normal write address is done with data writing (step S916: Yes), the memory controller 300 updates the status of the alternative write address to "vacant" in the address conversion table 312 (step S917). On the other hand, when determining that the alternative write address is done with data writing (step S916: No), the memory controller 300 correlates the alternative write address with the designated logical address in the address conversion table 312 (step S918). Also in the address conversion table 312, the memory controller 300 updates the status of the normal write address to "invalid" (step S919).

When determining that the data writing is failed (step S915: No), the memory controller 300 transmits a status being a write error notification to the host computer 100 (step S920). The memory controller 300 also updates the status of the normal write address and that of the alternative write address to "invalid" in the address conversion table 312 (step S912). After the process of step S917, S919, or S921, the controller-side write process is ended.

[Exemplary Operation of Nonvolatile Memory]

Figure 11:
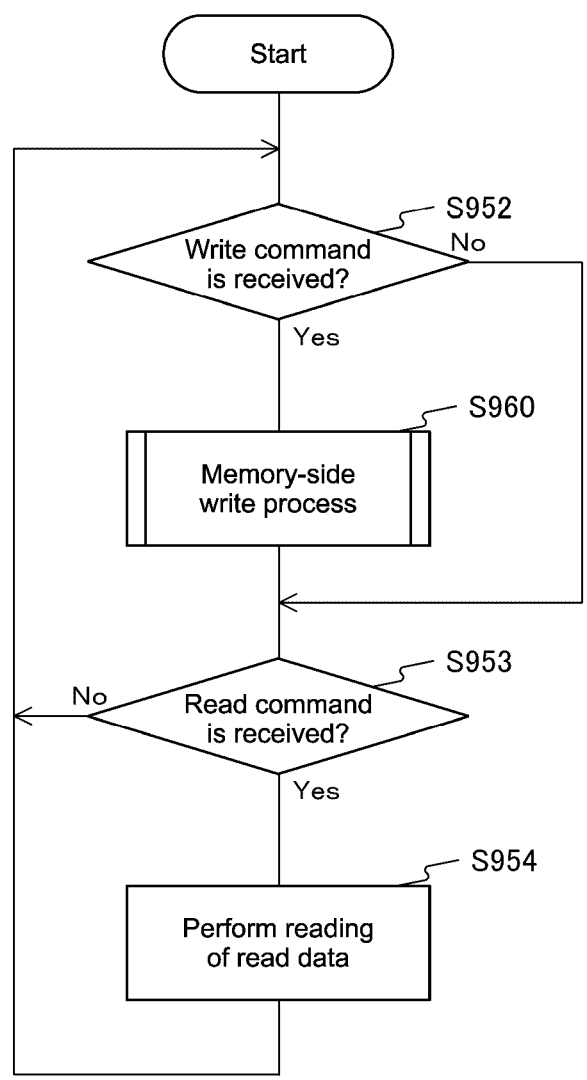
FIG. 11 is an exemplary operation flowchart for the nonvolatile memory in the first embodiment.

FIG. 11 is an exemplary operation flowchart for the nonvolatile memory 400 in the first embodiment. This operation is started when the storage 200 is turned on, for example.

The nonvolatile memory 400 determines whether a write command is provided by the memory controller 300 (step S952). When determining that the write command is provided (step S952: Yes), the nonvolatile memory 400 performs a memory-side write process (step S960). On the other hand, when determining that the write command is not provided (step S952: No) or after step S960, the nonvolatile memory 400 determines whether a read command is provided by the memory controller 300 (step S953).

When determining that the read command is provided (step S953: Yes), the nonvolatile memory 400 performs reading of read data, and transmits the read data to the memory controller 300 (step S954). When determining that the read command is not provided (step S953: No) or after step S954, the procedure returns to step S952.

Figure 12:
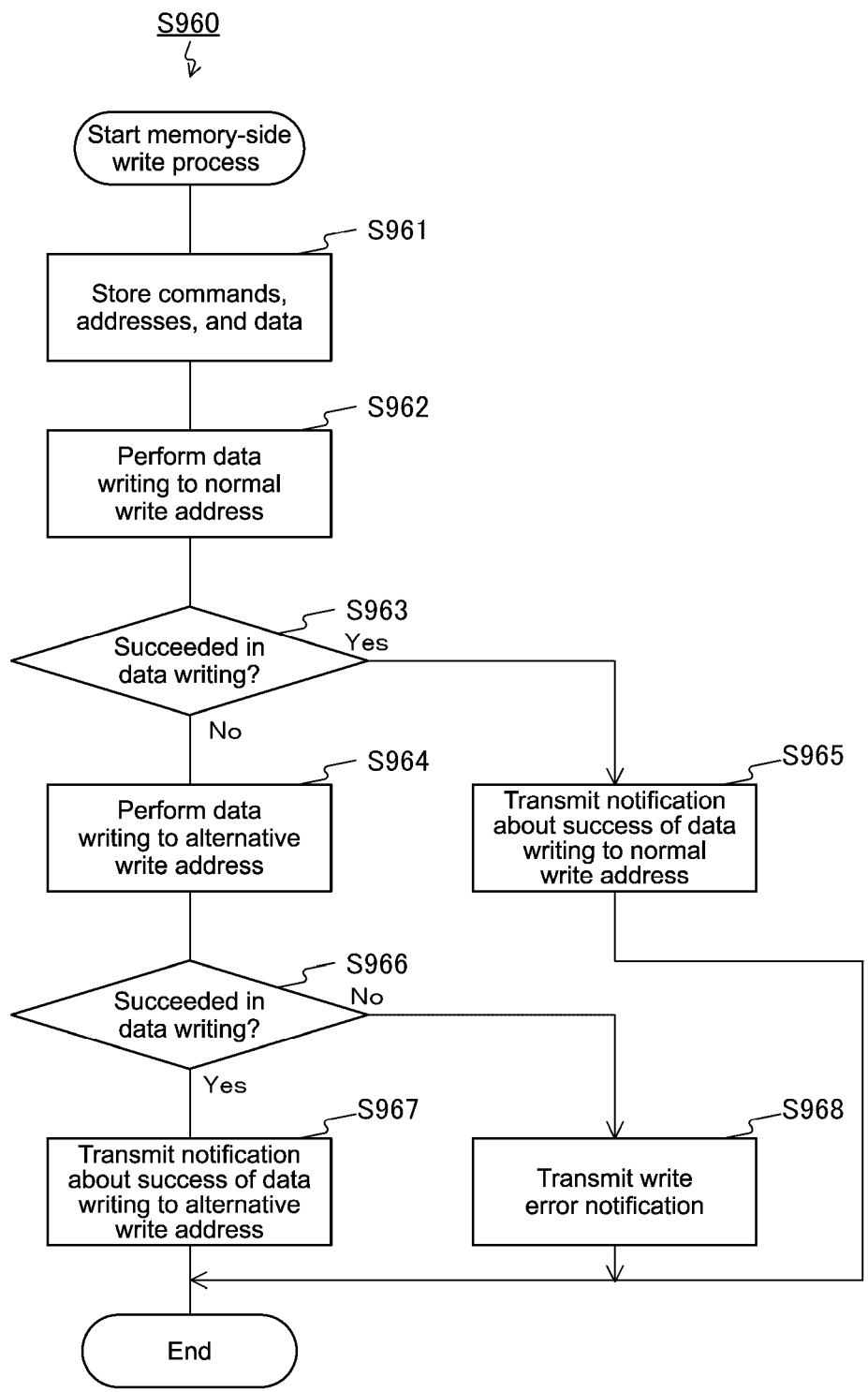
FIG. 12 is a flowchart of an exemplary memory-side write process in the first embodiment.

FIG. 12 is a flowchart of an exemplary memory-side write process in the first embodiment. The nonvolatile memory 400 stores commands, addresses, and data (step S961), and performs data writing to a normal write address (step S962).

The nonvolatile memory 400 then performs verification, and based on the verification result, determines whether the data writing to the normal write address is successful (step S963). When determining that the data writing is successful (step S963: Yes), the nonvolatile memory 400 generates a status being a notification about a success of the data writing to the normal write address, and transmits the status to the memory controller 300 (step S965). On the other hand, when determining that the data writing is failed (step S963: No), the nonvolatile memory 400 performs data writing this time to an alternative write address (step S964).

The nonvolatile memory 400 then performs verification, and based on the verification result, determines whether the data writing to the alternative write address is successful (step S966). When determining that the data writing is successful (step S966: Yes), the nonvolatile memory 400 generates a status being a notification about a success of the data writing to the alternative write address, and transmits the status to the memory controller 300 (step S967).

On the other hand, when determining that the data writing is failed (step S966: No), the nonvolatile memory 400 generates a status being a write error notification, and transmits the status to the memory controller 300 (step S968). After step S965, S967, or S968, the memory-side write process is ended.

As described above, according to the first embodiment of the present disclosure, the nonvolatile memory 400 obtains an alternative write address before data writing. This eliminates having to issue a write error and obtain an alternative write address even if data writing to a normal write address results in a failure. This accordingly prevents a delay to be caused by issuing a write error and obtaining an alternative write address, thereby being able to reduce the time for data writing. Therefore, the nonvolatile memory 400 is able to perform data writing at a high speed.

2. Second Embodiment

In the first embodiment, the memory controller 300 supplies an alternative write address every time issuing a write command. Alternatively, the memory controller 300 may supply in advance a plurality of alternative write addresses before issuing a write command. With a plurality of alternative write addresses provided in advance, the memory controller 300 is not expected any more to supply an alternative write address every time issuing a write command so that the time for data writing is reduced to a further degree. Unlike in the first embodiment, the memory controller 300 in the second embodiment supplies a plurality of alternative write addresses before issuing a write command.

Figure 13:
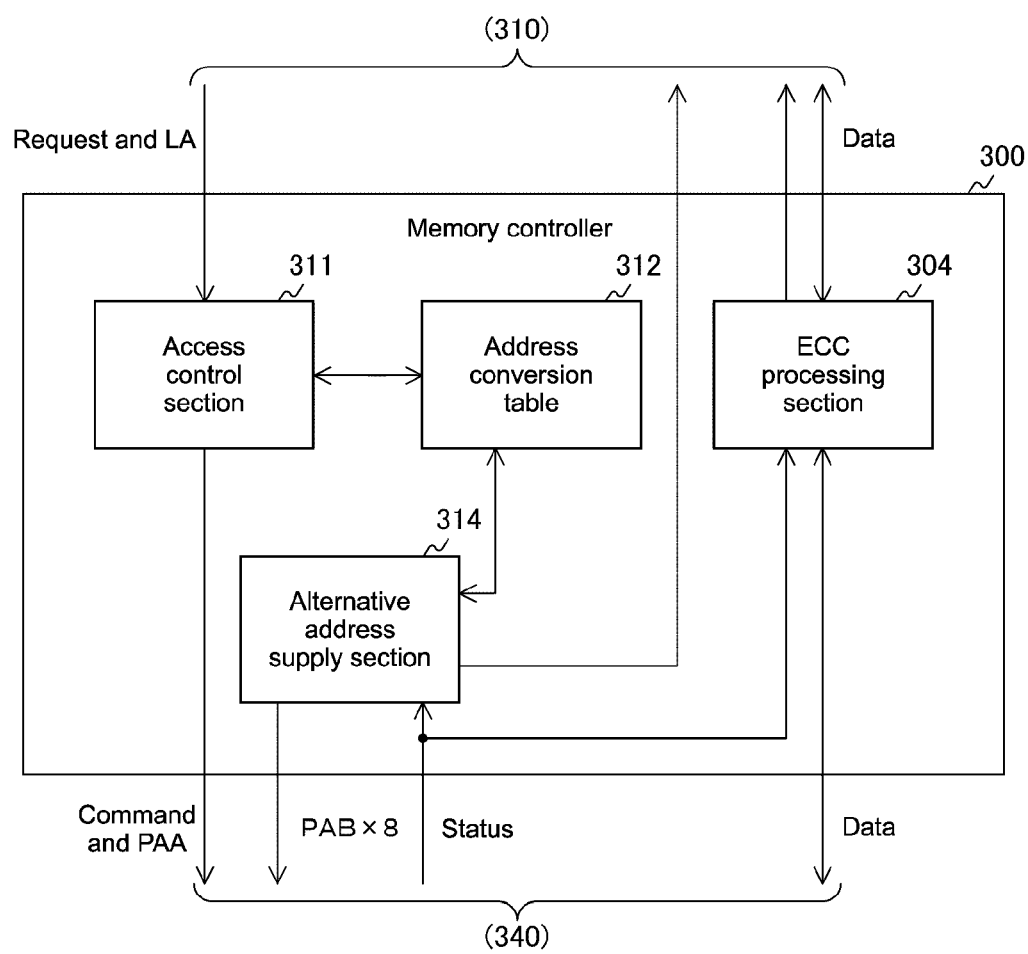
FIG. 13 is a block diagram showing an exemplary function structure of a memory controller in a second embodiment of the present disclosure.

FIG. 13 is a block diagram showing an exemplary function structure of the memory controller 300 in the second embodiment. Unlike in the first embodiment, the memory controller 300 in the second embodiment includes an alternative write address supply section 314 as an alternative to the alternative write address supply section 313.

Unlike the alternative write address supply section 313 in the first embodiment, the alternative write address supply section 314 supplies in advance a plurality of, e.g., eight, alternative write addresses to the nonvolatile memory 400 before issuing a write command. This alternative write address supply section 314 selects a plurality of "vacant" physical addresses when the initialization of the nonvolatile memory 400 is instructed by the host computer 100, for example. The alternative write address supply section 314 then supplies these physical addresses as alternative write addresses, and uprates their status to "in use".

Based on the status provided by the nonvolatile memory 400, the alternative write address supply section 314 updates the address conversion table 312 similarly to the first embodiment. Note that when a normal write address is done with data writing, the alternative write address supply section 314 does not update the status of the alternative write addresses to "vacant". When the alternative write addresses provided in advance to the nonvolatile memory 400 are all used, the alternative write address supply section 314 selects again a plurality of "vacant" physical addresses from the address conversion table 312. The alternative write address supply section 314 then supplies these physical addresses as different alternative write addresses, and updates their status to "in use".

Figure 14:
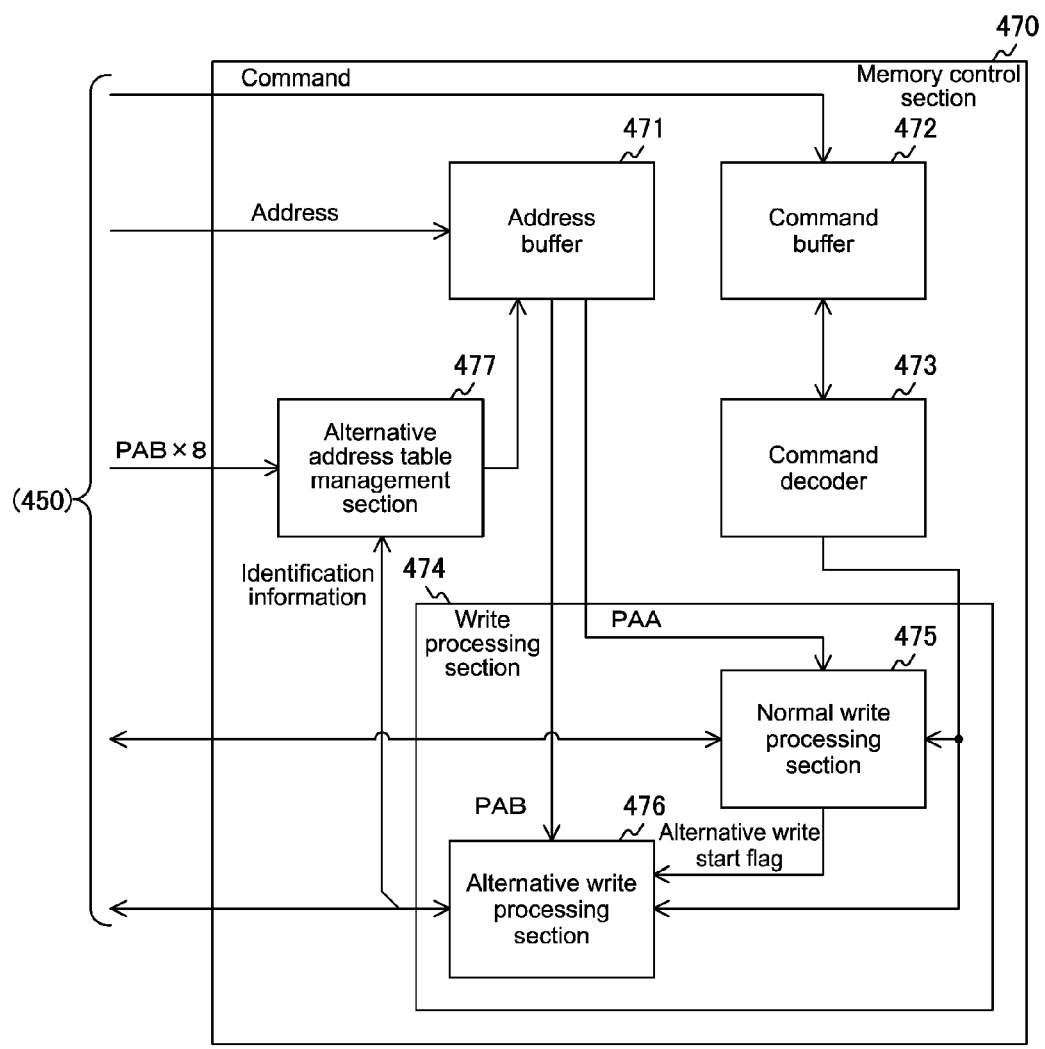
FIG. 14 is a block diagram showing an exemplary configuration of a memory control section in the second embodiment.

FIG. 14 is a block diagram showing an exemplary configuration of the memory control section 470 in the second embodiment. Unlike in the first embodiment, the memory control section 470 in the second embodiment additionally includes an alternative address table management section 477.

The alternative address table management section 477 is for managing an alternative address table. This alternative address table records an after-use flag for each alternative write address. This after-use flag indicates whether the alternative write address is done with data writing. The after-use flag indicates "used" when the alternative write address is done with data writing but otherwise indicates "not used". When obtaining a plurality of alternative write addresses from the memory controller 300, the alternative address table management section 477 makes the address buffer 471 store the alternative address table in which the after-use flags all indicate "not used". Herein, the address buffer 471 is an example of a storage section claimed in Claims.

The alternative write processing section 476 in the second embodiment refers to the alternative address table to select any of the alternative write addresses whose after-use flags indicate "not used", and the selected alternative write address is subjected to data writing. The alternative write processing section 476 then provides the alternative address table management section 477 with identification information for identifying which alternative write address is done with the data writing. The alternative write processing section 476 also generates a status additionally including the identification information, and supplies the status to the memory controller 300.

When receiving the identification information from the alternative write processing section 476, based on the identification information, the alternative address table management section 477 identifies the alternative write address in the alternative address table, and updates the after-use flag thereof to "used".

Figures 15, 16:
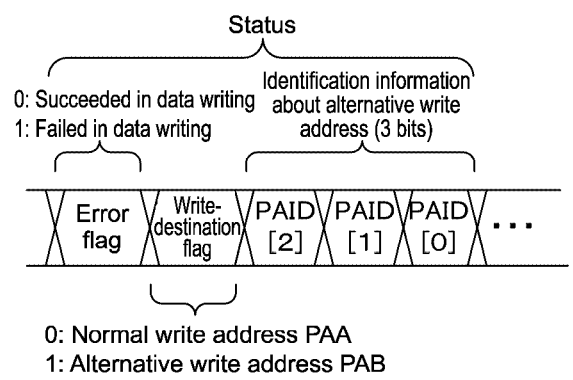
FIG. 15 is a diagram showing an exemplary alternative address table in the second embodiment.
FIG. 16 is a diagram showing an exemplary status in the second embodiment.

FIG. 15 is a diagram showing an exemplary alternative address table in the second embodiment. This alternative address table is recorded with a plurality of alternative write addresses. Each of the alternative write addresses is recorded with an after-use flag. Moreover, each of the alternative write addresses is assigned identification information.

As an example, when data writing is performed to an alternative write address PAB_0, in the alternative address table, a value of "1" indicating "used" is set to an after-use flag corresponding to the alternative write address PAB_0. When no data writing is performed to an alternative write address PAB_7, in the alternative address table, a value of "0" indicating "not used" is set to an after-use flag corresponding to the alternative write address PAB_7. Herein, the after-use flag indicating "used" in the alternative address table means that the status of the corresponding address is "in use" or "invalid" in the address conversion table 312. Moreover, the after-use flag indicating "not used" in the alternative address table means that the status of the corresponding address is "in use" in the address conversion table 312.

FIG. 16 is a diagram showing an exemplary status in the second embodiment. Unlike in the first embodiment, the status in the second embodiment additionally includes identification information about a 3-bit alternative write address. When an error flag indicates a failure of data writing, a write-destination flag and identification information are discarded.

The nonvolatile memory 400 transmits identification information about an alternative write address to the memory controller 300, but this is not restrictive. The nonvolatile memory 400 may transmit a data-written alternative write address itself as an alternative to the identification information. If the nonvolatile memory 400 is so configured as to select a plurality of alternative write addresses in a fixed order, e.g., in the ascending order of addresses, the identification information is not expected to be transmitted to the memory controller 300.

Figure 17:
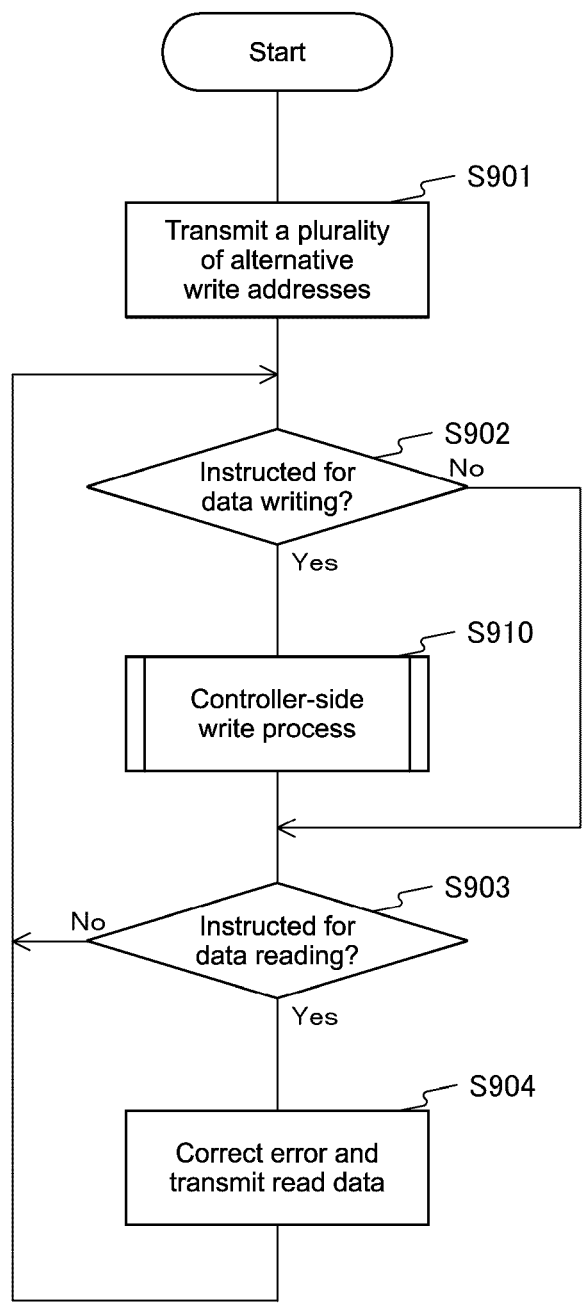
FIG. 17 is an exemplary operation flowchart for the memory controller in the second embodiment.

FIG. 17 is an exemplary operation flowchart for the memory controller 300 in the second embodiment. Unlike in the first embodiment, as the operation of the memory controller 300 in the second embodiment, the procedure additionally includes step S901.

The memory controller 300 transmits a plurality of alternative write addresses to the nonvolatile memory 400 (step S901), and then the procedure goes to step S902 and thereafter.

Figure 18:
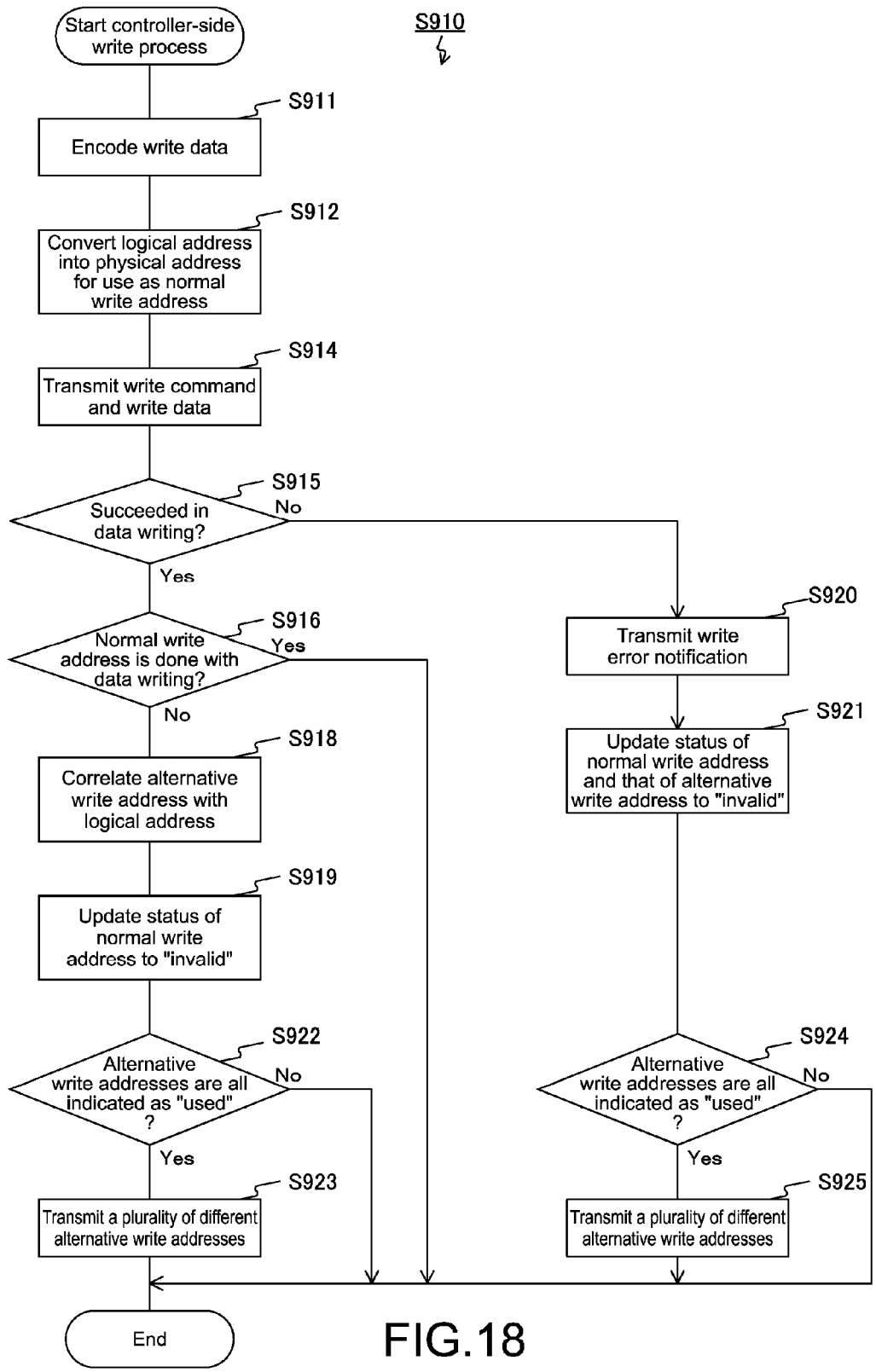
FIG. 18 is a flowchart of an exemplary controller-side write process in the second embodiment.

FIG. 18 is a flowchart showing an exemplary controller-side write process in the second embodiment. Unlike in the first embodiment, the controller-side write process in the second embodiment does not include steps S913 and S917, but additionally includes steps S922 to S925.

After updating the status of the normal write address to "invalid" (step S919), the memory controller 300 determines whether the alternative write addresses are all indicated as "used" (step S922). When determining that the alternative write addresses are all indicated as "used" (step S922: Yes), the memory controller 300 transmits a plurality of different alternative write addresses to the nonvolatile memory 400 (step S923).

After updating the status of the normal write address and that of the alternative write address to "invalid" (step S921), the memory controller 300 determines whether the alternative write addresses are all indicated as "used" (step S924). When determining that the alternative write addresses are all indicated as "used" (step S924: Yes), the memory controller 300 transmits a plurality of different alternative write addresses to the nonvolatile memory 400 (step S925).

When the normal write address is done with data writing (step S916), or when any of the alternative write addresses is indicated as "not used" (step S922 or S924: No), the controller-side write process is ended. After steps S923 and S925, the controller-side write process is ended.

Figure 19:
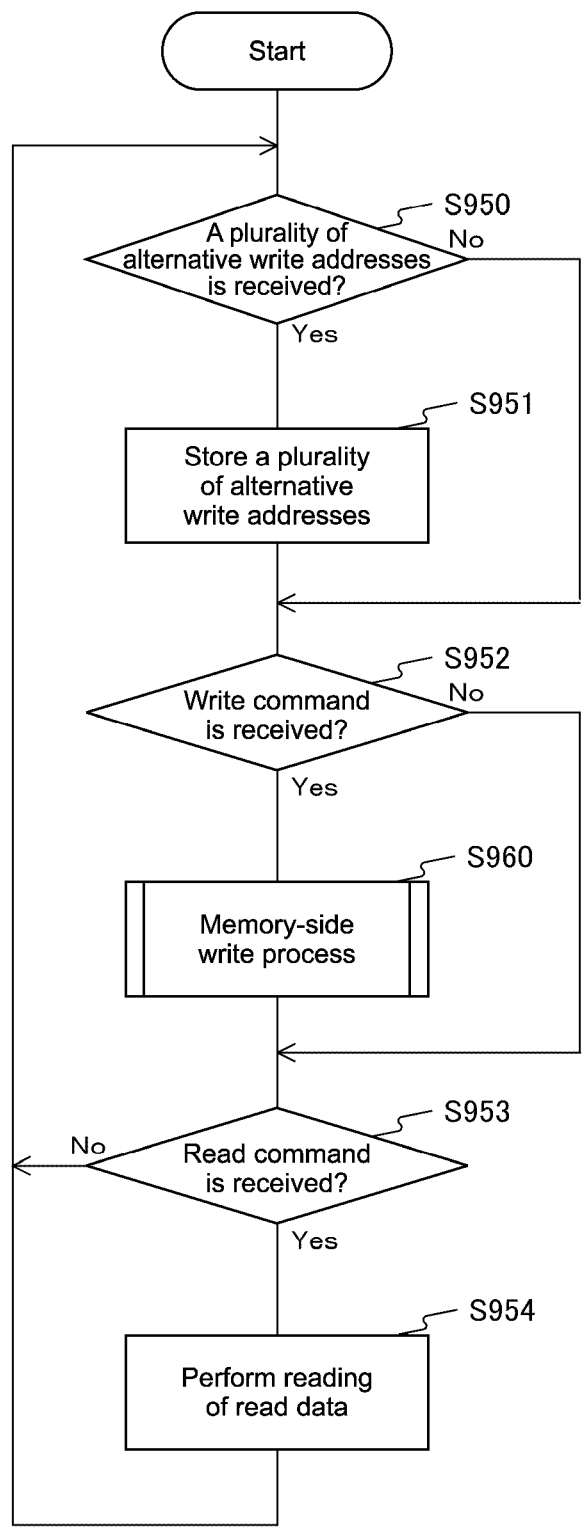
FIG. 19 is an exemplary operation flowchart for a nonvolatile memory in the second embodiment.

FIG. 19 is an exemplary operation flowchart for the nonvolatile memory 400 in the second embodiment. Unlike in the first embodiment, as the operation of the nonvolatile memory 400 in the second embodiment, the procedure additionally includes steps S950 and S951.

The nonvolatile memory 400 determines whether a plurality of alternative write addresses is provided by the memory controller 300 (step S950). When determining that a plurality of alternative write addresses is provided (step S950: Yes), the memory controller 300 stores the alternative write addresses. The alternative write addresses already stored therein are discarded (step S951). When determining that a plurality of alternative write addresses is not provided (step S950: No) or after step S951, the procedure goes to step S952 and thereafter.

When the nonvolatile memory 400 is not provided with a read command (step S953: No) or after step S954, the procedure returns to step S950.

Figure 20:
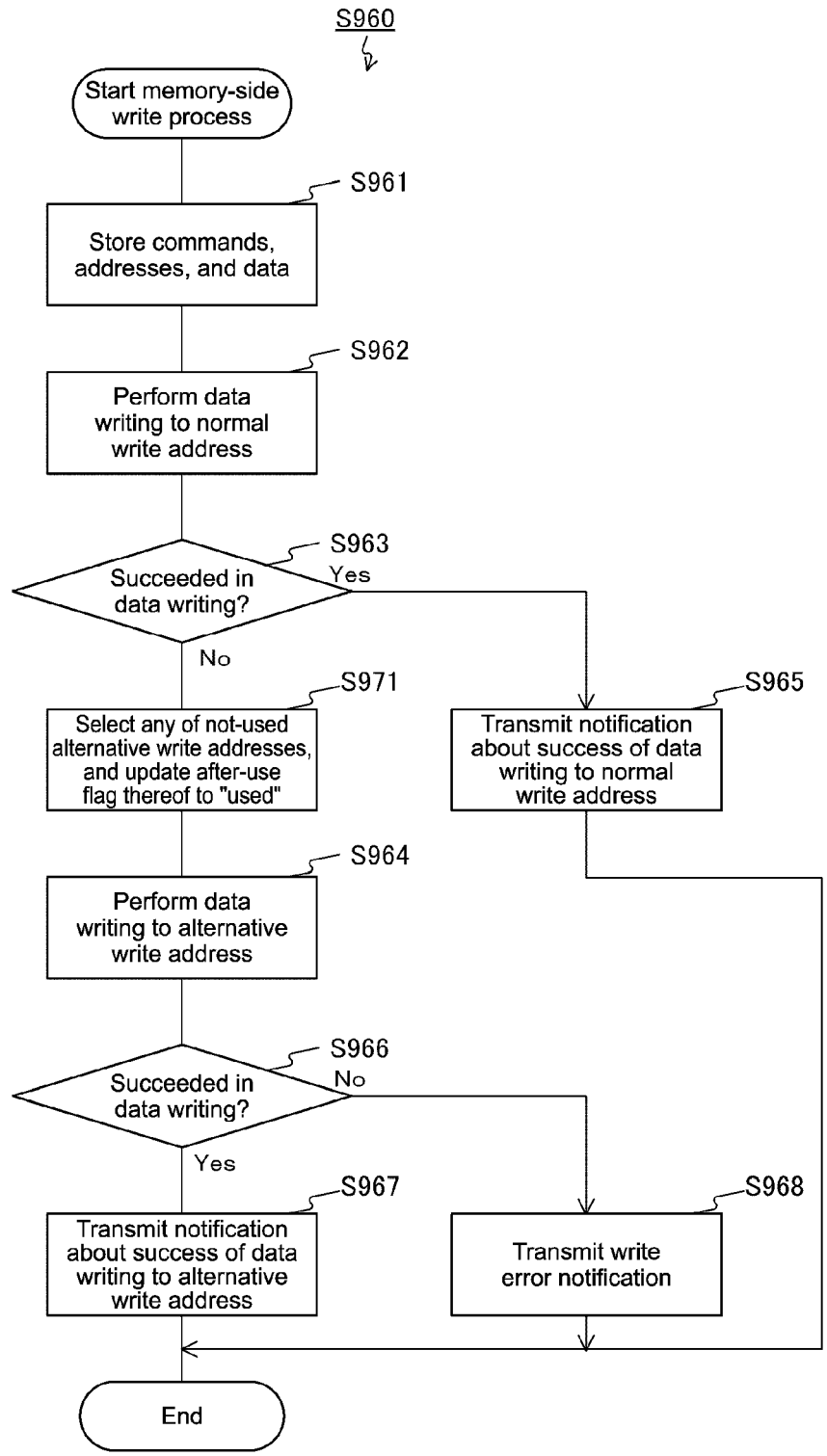
FIG. 20 is a flowchart of an exemplary memory-side write process in the second embodiment.

FIG. 20 is a flowchart of an exemplary memory-side write process in the second embodiment. Unlike in the first embodiment, the memory-side write process in the second embodiment additionally includes step S971.

When failing in writing to the normal write address (step S963: No), the nonvolatile memory 400 selects any of the "not used" alternative write addresses, and updates the after-use flag thereof to "used" (step S971). The nonvolatile memory 400 then performs data writing to the selected alternative write address (step S964).

Herein, the nonvolatile memory 400 issues a write error notification when failing in data writing to the alternative write address, but this is not restrictive. Alternatively, the nonvolatile memory 400 may repeatedly perform data writing to the "not used" alternative write addresses until all are done with data writing. If this is the configuration, the nonvolatile memory 400 generates a status when any of the alternative write addresses is successfully done with data writing, or when all of the alternative write addresses are not done with data writing.

As described above, according to the second embodiment of the present disclosure, the nonvolatile memory 400 obtains in advance a plurality of alternative write addresses before data writing. Therefore, the nonvolatile memory 400 is not expected any more to obtain an alternative write address every time performing data writing so that the time for data writing is reduced to a further degree.

Note that the above-mentioned embodiments are examples of embodying the present disclosure, and the matters in the embodiments are respectively correlated with the matters in Claims specifying the present disclosure. Similarly, the matters in Claims specifying the present disclosure are respectively correlated with the matters under the same names in the embodiments of the present disclosure. It is understood that numerous other modifications and variations can be devised without departing from the scope of the present disclosure.

The procedure processes described in the above embodiments may be understood as a method including these procedure processes, or as a program to be run for a computer to perform the procedure processes, or as a recording medium storing the program. This recording medium is exemplified by a CD (Compact Disc), an MD (MiniDisc), a DVD (Digital Versatile Disc), a memory card, and a Blu-ray (trademark) Disc.

The present disclosure may be also in the following structures.

(1) A storage apparatus, including:

an address obtaining section configured to obtain a normal write address and an alternative write address before data writing to the normal write address, the normal write address being designated as a destination of the data writing, the alternative write address being used when the data writing is failed; and a write processing section configured to perform the data writing to the normal write address when instructed for the data writing, and perform the data writing to the alternative write address when the data writing to the normal write address is failed.

(2) The storage apparatus according to (1), in which
the write processing section includes
a normal write processing section configured to perform the data writing to the normal write address when instructed for the data writing, and
an alternative write processing section configured to perform the data writing to the alternative write address when the data writing to the normal write address is failed.

(3) The storage apparatus according to (1) or (2), further including:
a storage section configured to store management information indicating whether each alternative write address of a plurality of alternative write addresses is done with the data writing,
in which
the address obtaining section obtains the alternative write addresses before the data writing to the normal write address, and
when the data writing to the normal write address is failed, the write processing section refers to the management information to select any of the alternative write addresses not done with the data writing, and performs the data writing to the alternative write address.

(4) The storage apparatus according to (1) or (2), in which
the address obtaining section obtains the normal write address and the alternative write address from a write command asking for the data writing, and
the write processing section performs the data writing in accordance with the write command.

(5) A control apparatus, including:
an access control section configured to issue an instruction for data writing; and
an address supply section configured to supply a normal write address and an alternative write address before the data writing to the normal write address, the normal write address being designated as a destination for the data writing, the alternative write address being used when the data writing is failed.

(6) A storage system, including:
an access control section configured to issue an instruction for data writing;
an address supply section configured to supply a normal write address and an alternative write address before the data writing to the normal write address, the normal write address being designated as a destination for the data writing, the alternative write address being used when the data writing is failed;
an address obtaining section configured to obtain the normal write address and the alternative write address before the data writing to the normal write address; and
a write processing section configured to perform the data writing to the normal write address when instructed for the data writing, and perform the data writing to the alternative write address when the data writing to the normal write address is failed.

(7) The storage system according to (6), in which
the write processing section includes
a normal write processing section configured to perform the data writing to the normal write address when instructed for the data writing, and
an alternative write processing section configured to perform the data writing to the alternative write address when the data writing to the normal write address is failed.

(8) The storage system according to (6) or (7), in which
the address supply section supplies a plurality of alternative write addresses before the data writing to the normal write address,
the write processing section notifies the address supply section of identification information every time performing the data writing to any of the alternative write addresses, the identification information being information for identifying which of the alternative write addresses is done with the data writing, and
the address supply section refers to the identification information to determine whether the alternative write addresses are all done with the data writing, and when determining that the alternative write addresses are all done with the data writing, supplies a plurality of different alternative write addresses.

(9) The storage system according any one of (6) to (8), further including
an address conversion table showing a correlation between a logical address and a physical address, wherein
when any of logical addresses is designated as a destination for the data writing, the address supply section supplies any of physical addresses not correlated with the designated logical address as the alternative write address,
after performing the data writing to the alternative write address, the write processing section determines whether the data writing is successful, and when determining that the data writing is successful, notifies the address supply section that the alternative write address is done with the data writing, and
when notified that the alternative write address is done with the data writing, the address supply section establishes a correlation between the alternative write address and the designated logical address in the address conversion table.

(10) A control method in a storage apparatus, the method including:
obtaining, by an address obtaining section, a normal write address and an alternative write address before data writing to the normal write address, the normal write address being designated as a destination of the data writing, the alternative write address being used when the data writing is failed; and
performing, by a write processing section, the data writing to the normal write address when instructed for the data writing, and performing the data writing to the alternative write address when the data writing to the normal write address is failed.

It should be understood by those skilled in the art that various modifications, combinations, sub-combinations and alterations may occur depending on design requirements and other factors insofar as they are within the scope of the appended claims or the equivalents thereof.

What is claimed is:
1. A storage apparatus, comprising:
an address obtaining section configured to obtain a normal write address and an alternative write address before data writing to the normal write address, the normal write address being designated as a destination of the data writing, the alternative write address being used when the data writing has failed; and a write processing section configured to perform the data writing to the normal write address when instructed for the data writing, and perform the data writing to the alternative write address when the data writing to the normal write address has failed, wherein the address obtaining section obtains the normal write address and the alternative write address from a write command asking for the data writing, and the write processing section performs the data writing in accordance with the write command, the address obtaining section refers to identification information to determine whether the alternative write addresses are all done with the data writing, the identification information is information for identifying which of the alternative write addresses is done with the data writing, and the address obtaining section supplies a plurality of different alternative write addresses when determining that the alternative write addresses are all done with the data writing.

2. The storage apparatus according to claim 1, wherein the write processing section includes:

a normal write processing section configured to perform the data writing to the normal write address when instructed for the data writing, and an alternative write processing section configured to perform the data writing to the alternative write address when the data writing to the normal write address has failed.

3. The storage apparatus according to claim 1, further comprising:

a storage section configured to store management information indicating whether each alternative write address of a plurality of alternative write addresses is done with the data writing,
wherein the address obtaining section obtains the alternative write addresses before the data writing to the normal write address, and when the data writing to the normal write address has failed, the write processing section refers to the management information to select any of the alternative write addresses not done with the data writing, and performs the data writing to the alternative write address.

4. A storage system, comprising:

an access control section configured to issue an instruction for data writing;

an address supply section configured to supply a normal write address and an alternative write address before the data writing to the normal write address, the normal write address being designated as a destination for the data writing, the alternative write address being used when the data writing has failed;

an address obtaining section configured to obtain the normal write address and the alternative write address before the data writing to the normal write address; and a write processing section configured to perform the data writing to the normal write address when instructed for the data writing, and perform the data writing to the alternative write address when the data writing to the normal write address has failed, wherein the address supply section supplies a plurality of alternative write addresses before the data writing to the normal write address, the write processing section notifies the address supply section of identification information every time performing the data writing to any of the alternative write addresses, the identification information being information for identifying which of the alternative write addresses is done with the data writing, and the address supply section refers to the identification information to determine whether the alternative write addresses are all done with the data writing, and when determining that the alternative write addresses are all done with the data writing, supplies a plurality of different alternative write addresses.

5. The storage system according to claim 4, wherein the write processing section includes a normal write processing section configured to perform the data writing to the normal write address when instructed for the data writing, and an alternative write processing section configured to perform the data writing to the alternative write address when the data writing to the normal write address has failed.

6. The storage system according to claim 4, further comprising an address conversion table showing a correlation between a logical address and a physical address, wherein when any of logical addresses is designated as a destination for the data writing, the address supply section supplies any of physical addresses not correlated with the designated logical address as the alternative write address, after performing the data writing to the alternative write address, the write processing section determines whether the data writing is successful, and when determining that the data writing is successful, notifies the address supply section that the alternative write address is done with the data writing, and when notified that the alternative write address is done with the data writing, the address supply section establishes a correlation between the alternative write address and the designated logical address in the address conversion table.

* * * * *